United States Patent
Kotani et al.

(10) Patent No.: US 7,506,301 B2
(45) Date of Patent: Mar. 17, 2009

(54) METHOD FOR CORRECTING A MASK PATTERN, SYSTEM FOR CORRECTING A MASK PATTERN, PROGRAM, METHOD FOR MANUFACTURING A PHOTOMASK AND METHOD FOR MANUFACTURING A SEMICONDUCTOR DEVICE

(75) Inventors: Toshiya Kotani, Machida (JP); Satoshi Tanaka, Kawasaki (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 353 days.

(21) Appl. No.: 11/205,180

(22) Filed: Aug. 17, 2005

(65) Prior Publication Data
US 2006/0039597 A1 Feb. 23, 2006

(30) Foreign Application Priority Data
Aug. 18, 2004 (JP) .............................. 2004-238366

(51) Int. Cl.
*G06F 17/50* (2006.01)

(52) U.S. Cl. ......................................... 716/19; 716/21
(58) Field of Classification Search ............. 716/19–21; 430/5, 22, 30
See application file for complete search history.

(56) References Cited

U.S. PATENT DOCUMENTS 6,453,274 B2    9/2002  Kamon
6,567,972 B1 *  5/2003  Tanaka et al. .................. 716/21

* cited by examiner

*Primary Examiner*—Paul Dinh
(74) *Attorney, Agent, or Firm*—Finnegan, Henderson, Farabow, Garrett & Dunner, L.L.P.

(57) ABSTRACT

A computer implemented method for correcting a mask pattern includes: predicting a displacement of a device pattern by using a mask pattern to form the device pattern and a variation of a process condition; determinating an optical proximity correction value so that the displacement falls within a displacement tolerance of the device pattern; and correcting the mask pattern using the optical proximity correction value.

12 Claims, 17 Drawing Sheets

METHOD FOR CORRECTING A MASK PATTERN, SYSTEM FOR CORRECTING A MASK PATTERN, PROGRAM, METHOD FOR MANUFACTURING A PHOTOMASK AND METHOD FOR MANUFACTURING A SEMICONDUCTOR DEVICE

CROSS REFERENCE TO RELATED APPLICATIONS AND INCORPORATED BY REFERENCE

The application is based upon and claims the benefit of priority from the prior Japanese Patent Applications No. P2004-238366, filed on Aug. 18, 2004; the entire contents of which are incorporated herein by reference.

BACKGROUND OF THE INVENTION

1. Field of the Invention

The present invention relates to technology for correcting a mask pattern, more particularly, to a method for correcting a mask pattern, a system for correcting a mask pattern, program, a method for manufacturing a photomask and a method for manufacturing a semiconductor device.

2. Description of the Related Art

In recent years, technologies for manufacturing semiconductor integrated circuits have made very remarkable progress, and semiconductor integrated circuits with a minimum size of 0.13 µm are mass produced. Feature size of the semiconductor integrated circuits has been decreased by the rapid progress of the technology to form micropatterns including a mask process technology, photolithography technology, and etching technology. In a period when the pattern size was large enough, a planar shape of a device pattern desired to be formed on a wafer was drawn as a design pattern with no modification, and a mask pattern true to the design pattern was formed. The mask pattern was then transferred onto the wafer by a projection optical system to process a substrate. The device pattern can therefore be formed to be substantially identical to the design pattern.

However, the progress in decrease of pattern size has caused a problem that the size of the device pattern is not identical to the size of the design pattern. Accordingly, processing (hereinafter, referred to as "mask data processing") to correct a mask pattern so that the size of the device pattern is equal to the size of the design pattern has become very important. For performing the mask data processing, an optical proximity correction (OPC) process to correct the optical proximity effect (OPE) is known.

In recent years, along with the reduction in size of the device pattern, a k1 value (k1=W/(NA/λ), where W represents design size, λ represents exposure wavelength, and NA represents numerical aperture of a projection lens) of a lithography process is continuously decreased. Accordingly, the OPE tends to further increase, and load on the OPC process becomes very large. As a method to achieve high accuracy in the OPC processing, a "model-based OPC" is favored, which predicts the OPE using a illumination intensity simulator and corrects a mask pattern.

In the model-based OPC, the mask pattern is corrected such that the size of the device pattern is identical to the size of the design pattern under a particular process condition of a best focus value or the like. When the particular process condition is no longer satisfied during transfer of the mask pattern to form the device pattern, the size of the device pattern sometimes varies, and a desired specification of a device implemented by the device pattern cannot be achieved. To achieve the desired specification, the device pattern must be formed under the particular process condition, and a sufficient process margin cannot be ensured.

SUMMARY OF THE INVENTION

An aspect of the present invention inheres in a method for correcting a mask pattern including: predicting a displacement of a device pattern by using a mask pattern to form the device pattern and a variation of a process condition; determining an optical proximity correction value so that the displacement falls within a displacement tolerance of the device pattern; and correcting the mask pattern using the optical proximity correction value.

Another aspect of the present invention inheres in a system for correcting a mask pattern including a displacement prediction unit configured to predict a displacement of a device pattern by using a mask pattern to form the device pattern and a variation of a process condition; and a correction unit configured to determine an optical proximity correction value so that the displacement falls within a displacement tolerance of the device pattern, and to correct the mask pattern using the optical proximity correction value.

An additional aspect of the present invention inheres in a program including instructions for predicting a displacement of a device pattern by using a mask pattern to form the device pattern and a variation of a process condition; instructions for determining an optical proximity correction value so that the displacement falls within a displacement tolerance of the device pattern; and instructions for correcting the mask pattern using the optical proximity correction value.

Further additional aspect of the present invention inheres in a method for manufacturing a photomask including predicting a displacement of a device pattern by using a mask pattern to form the device pattern of the photomask and a variation of a process condition; determinating an optical proximity correction value so that the displacement falls within a displacement tolerance of the device pattern for manufacturing a semiconductor device; correcting the mask pattern using the optical proximity correction value to generate mask data of the corrected mask pattern; generating the corrected mask pattern of a photoresist film coated on a light shielding film of a mask substrate, based on the mask data by using the pattern generator; and forming the corrected mask pattern made from the light shielding film by processing the light shielding film using the photoresist film as a mask.

Further additional aspect of the present invention inheres in a method for manufacturing a semiconductor device including predicting a displacement of a device pattern by using a mask pattern for forming the device pattern and a variation of a process condition; determining an optical proximity correction value so that the displacement falls within a displacement tolerance of the device pattern; and correcting the mask pattern using the optical proximity correction value; generating the corrected mask pattern on a mask substrate; coating a photoresist film on a semiconductor wafer; and transferring an image of the corrected mask pattern on the mask substrate to the photoresist film.

DETAILED DESCRIPTION OF THE INVENTION

Figure 1:
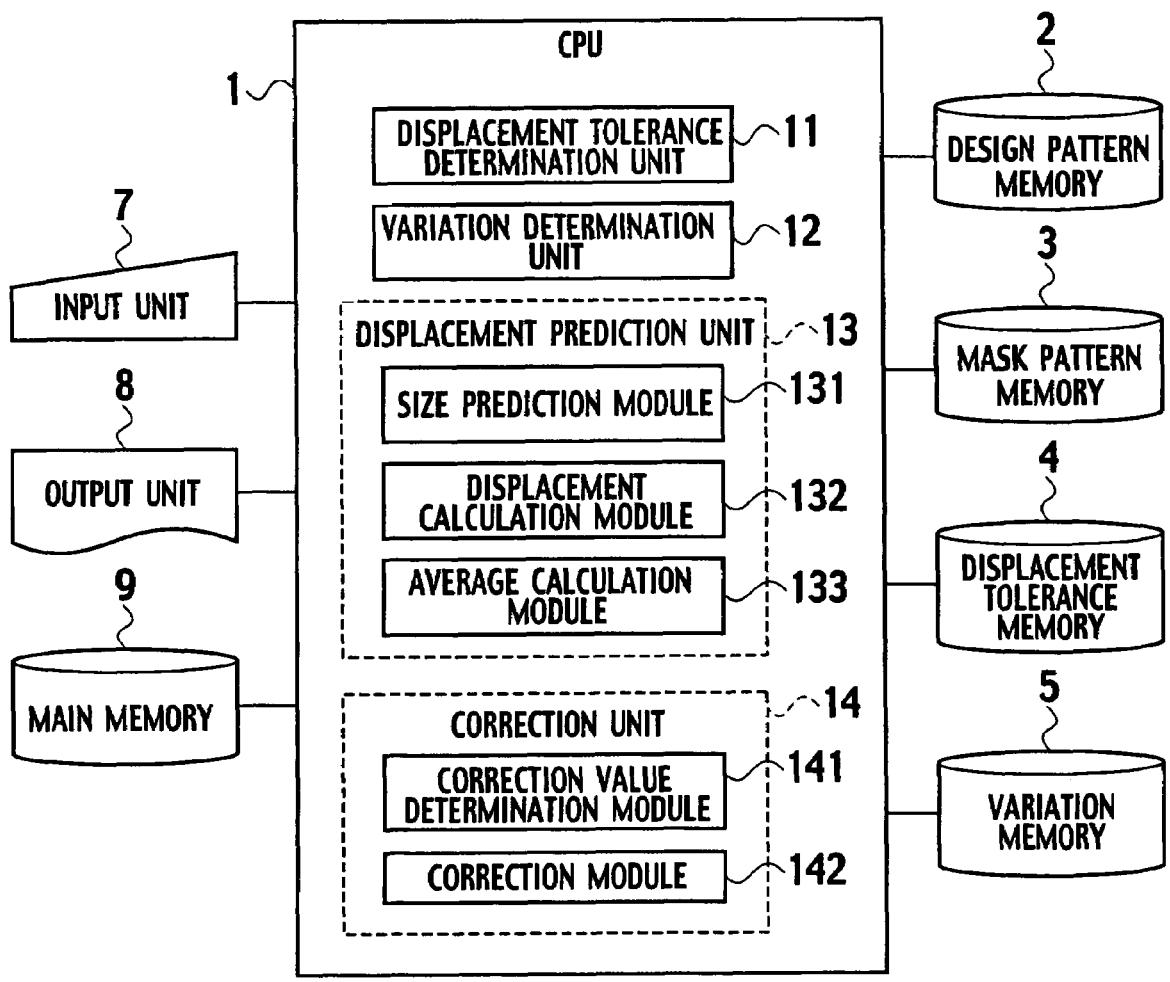
FIG. 1 is a block diagram showing an example of a mask pattern correction system according to an embodiment of the present invention.

An embodiment and various modifications of the present invention will be described with reference to the accompanying drawings. It is to be noted that the same or similar reference numerals are applied to the same or similar parts and elements throughout the drawings, and the description of the same or similar parts and elements will be omitted or simplified.

As shown in FIG. 1, a mask pattern correction system according to the embodiment of the present invention includes a central processing unit (CPU) 1, a design pattern memory 2, a mask pattern memory 3, a displacement tolerance memory 4, a variation memory 5, an input unit 7, an output unit 8, and a main memory 9. The design pattern memory 2 stores design patterns of a semiconductor integrated circuit. The design patterns are formed by various patterns such as an isolated pattern or a line and space (L/S) pattern. The design pattern memory 2 stores, for example, a design pattern (isolated pattern) 101 shown in FIG. 2.

The mask pattern memory 3 shown in FIG. 1 stores initial mask patterns corresponding to the design patterns stored in the design pattern memory 2. The "initial mask pattern" refers to a pattern prior to being subjected to the OPC or a pattern corrected by a temporarily set correction value of the OPC. The mask pattern memory 3 stores, for example, an initial mask pattern 102 shown in FIG. 3 corresponding to the design pattern 101 shown in FIG. 2.

Figure 2:
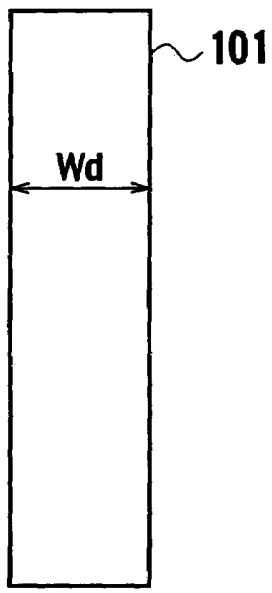
FIG. 2 is a schematic view showing an example of a design pattern according to the embodiment of the present invention.
Figure 3:
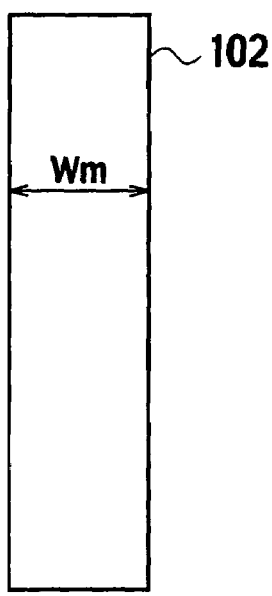
FIG. 3 is a schematic view showing an example of a predicted device pattern according to the embodiment of the present invention.
Figure 4:
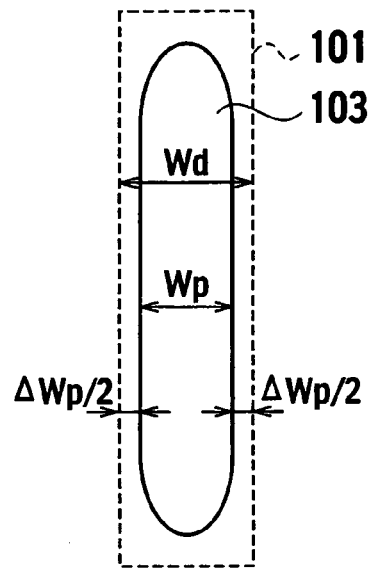
FIG. 4 is a schematic view showing an example of a mask pattern before correction according to the embodiment of the present invention.

In an actual manufacturing process of a semiconductor integrated circuit, a photomask is formed on a mask substrate of silica glass or the like, using an electron beam pattern generator, based on mask data including the mask pattern 102 shown in FIG. 3. The mask pattern of the photomask is transferred to a photoresist film on a semiconductor wafer and developed using an exposure system (stepper) to pattern the photoresist film. Using the patterned photoresist film as a processing mask, a base film is processed. A device pattern 103 shown in FIG. 4 is thus formed. In the embodiment of the present invention, as described later, the device pattern 103 shown in FIG. 4 is predicted by simulation based on the design pattern 101 shown in FIG. 2 and the mask pattern 102 shown in FIG. 3.

In the formation of the device pattern 103, various kinds of process conditions vary, and a displacement $\Delta Wp$ of a size Wp of the device pattern 103 (hereinafter, just referred to as a displacement) is sometimes generated with respect to a size Wd of the design pattern 101 as shown in FIG. 4. Herein, examples of the process conditions are: an exposure condition, a focus condition, an aberration condition, and an optical beam shape when the mask pattern is transferred to the resist film, the size of the resist pattern obtained by transferring images of the mask patterns, and etching conditions when the base film is processed by using the resist pattern obtained by transferring images of the mask patterns as a mask.

The CPU 1 shown in FIG. 1 includes a displacement tolerance determination unit 11, a variation determination unit 12, a displacement prediction unit 13, and a correction unit 14. The displacement tolerance determination unit 11 determines a displacement tolerance based on a desired specification of a device implemented with the device pattern 103 corresponding to the design pattern 101 stored in the design pattern memory 2. The "displacement tolerance" refers to a range of the displacement acceptable to obtain the desired specification of the device implemented with the device pattern 103. The displacement tolerance may be previously stored in the displacement tolerance memory 4 through the input unit 7 or the like.

The variation determination unit 12 shown in FIG. 1 determines a process condition variation in the formation of the device pattern 103 based on the displacement tolerance stored in the displacement tolerance memory 4, the specification of the exposure system, and the like. Examples of the process condition variation are, for example, variations of the exposure, focus value, aberration, and optical beam shapes when the mask pattern is transferred to the resist film, a variation of the size of the resist pattern obtained by transferring images of the mask patterns, and a variation of the size of the etching condition when the base film is processed by using the mask pattern obtained by transferring images of the mask patterns as a mask.

Figure 5:
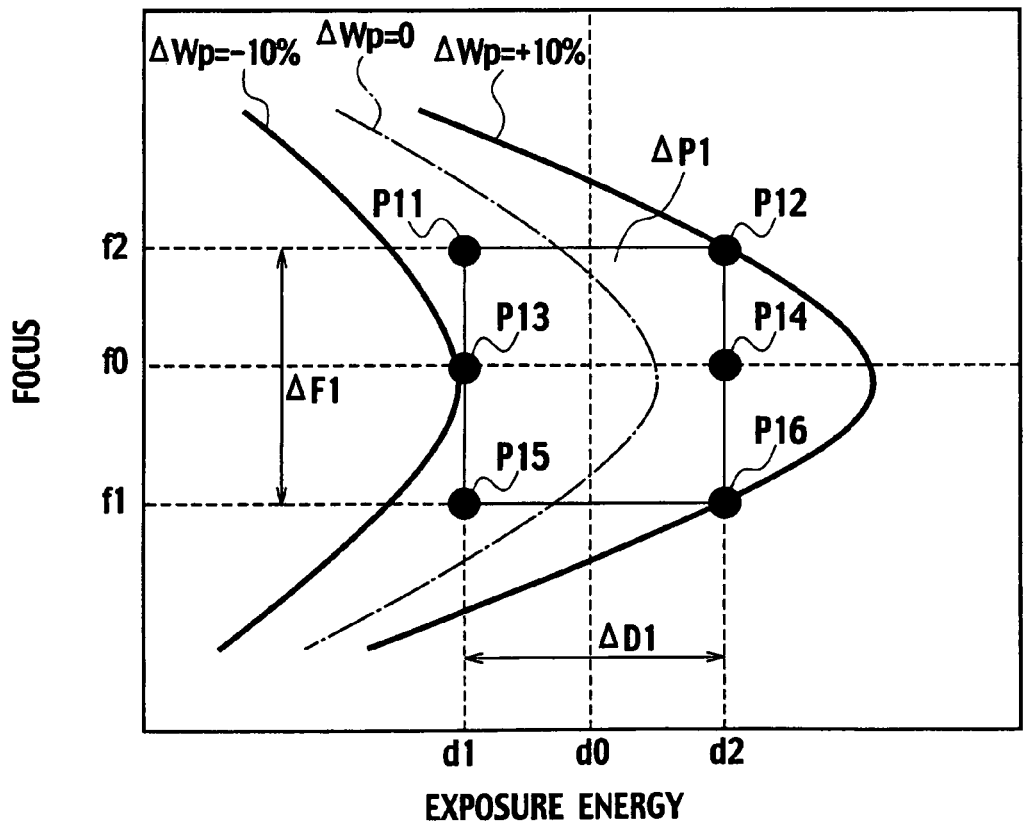
FIG. 5 is a graph showing an example of an ED-tree of an isolation pattern according to the embodiment of the present invention.

In an ED tree shown in FIG. 5, real lines ($\Delta Wp=\pm 10\%$) represent the exposure and focus when the design pattern (isolated pattern) 101 shown in FIG. 2 has displacements of $\pm 10\%$. A dash dotted line ($\Delta Wp=0$) represents the exposure and focus when the displacement is 0, that is, when the size Wd of the design pattern 101 is equal to the size Wp of the device pattern 103. Herein, when the displacement tolerance ranges from $-10\%$ to $+10\%$, an area sandwiched by the real lines ($\Delta Wp=\pm 10\%$) represents the exposure and focus to fulfill the displacement tolerance.

When the displacement tolerance ranges from $-10\%$ to $+10\%$, the variation determination unit 12 shown in FIG. 1 determines, for example, a process condition variation $\Delta P1$ (rectangular window) as shown in FIG. 5. On the X-axis of the process condition variation $\Delta P1$, a variation $\Delta D1$ of the exposure between a lower limit d1 and an upper limit d2 is defined. On the Y-axis of the process condition variation $\Delta P1$, a variation $\Delta F1$ is defined between a lower limit f1 and an upper limit f2. The process condition variation $\Delta P1$ may be previously stored in the variation memory 5 through the input unit 7 shown in FIG. 1 or the like.

The displacement prediction unit 13 reads the initial mask pattern 102 stored in the mask pattern memory 3 and shown in FIG. 3 and the process condition variation $\Delta P1$ stored in the variation memory 5 and shown in FIG. 5. The displacement prediction unit 13 then predicts, by simulation, the displacement $\Delta Wp$ shown in FIG. 4 corresponding to the process condition variation $\Delta P1$. The displacement prediction unit 13 shown in FIG. 1 includes a size prediction module 131, a displacement calculation module 132, and an average calculation module 133.

The size prediction module 131 reads the process condition variation $\Delta P1$ stored in the variation memory 4 and shown in FIG. 5. The size prediction module 131 then predicts a plurality of sizes Wp in the device pattern 103 according to process conditions at respective limits P11 to P16 of the process condition variation $\Delta P1$. The limits P11 to P16 of the process condition variation $\Delta P1$ are selected at the lower and upper limits d1 and d2 of the exposure at the upper limit f2 of the focus, the lower and upper limits d1 and d2 of the exposure at a best focus f0, and the lower and upper limits d1 and d2 of the exposure at the lower limit f1 of the focus, respectively.

The displacement calculation module 132 shown in FIG. 1 calculates a difference (Wd−Wp) between each of the plurality of sizes Wp of the device pattern 103 and the size Wd of the design pattern 101 as the displacement $\Delta Wp$. For example, the plurality of displacements $\Delta Wp$ according to the respective process conditions at the plurality of limits P11 to P16 of the process condition variation $\Delta P1$ shown in FIG. 5 are calculated to be 2, −7, 4, −6, 2, and −7 nm, respectively. The average calculation module 133 shown in FIG. 1 calculates an average (for example, 2 nm) of the plurality of displacements $\Delta Wp$ calculated by the displacement calculation module 132.

Figure 6:
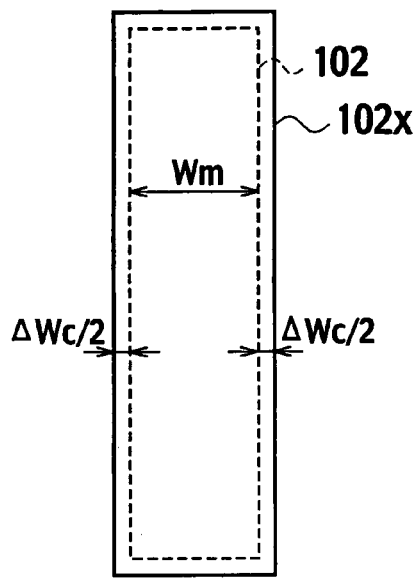
FIG. 6 is a schematic view showing an example of a mask pattern after correction according to the embodiment of the present invention.

The correction unit 14 includes a correction value determination module 141 and a correction module 142. The correction value determination module 141 reads the displacement tolerance stored in the displacement tolerance memory 4. The correction value determination module 141 then determines whether the average of the plurality of displacements $\Delta Wp$ calculated by the average calculation module 133 falls within the displacement tolerance. The correction value determination module 141 then determines an optical proximity correction value $\Delta Wc$ so that the calculated average falls within the displacement tolerance. For example, when the displacement tolerance ranges from −1 to 1 nm and the average of the plurality of displacements $\Delta Wp$ is −2 nm, the correction value determination module 141 determines the optical proximity correction value $\Delta Wc$ to be 1 nm. Using the optical proximity correction value $\Delta Wc$ determined by the correction value determination module 141, the correction module 142, as shown in FIG. 6, corrects (increases) the size Wm of the initial mask pattern 102 by the optical proximity correction value $\Delta Wc$.

The CPU 1 further includes a memory manager (not shown). The memory manager controls the design pattern memory 2, the displacement tolerance memory 4, the variation memory 5 and the mask pattern memory 3 for reading and writing.

The mask pattern memory 3 further stores the mask pattern 102 corrected by the correction unit 14. The input unit 7 may be, for example, a keyboard, a mouse, a recognition device such as an optical character readers (OCR), a drawing input device such as an image scanner, or a special input unit such as a voice input device. The output unit 8 may be a display device such as a liquid crystal display (LCD), CRT display, or a printing device such as an ink jet printer or a laser printer.

The main memory 9 includes read-only memory (ROM) and random-access memory (RAM). The ROM stores a program executed by the CPU 1 (the details of the program are described later). The RAM serves as a temporary data memory for storing data used in executing a program by the CPU 1, and used as a working domain. As the main memory 9, a flexible disk, a CD-ROM, a MO disk, etc. can be used. The system shown in FIG. 1 further has an input/output manager (interface) (not shown) connecting the input unit 7, the output unit 8 and so on to the CPU 1.

Next, a method for correcting a mask pattern according to the embodiment of the present invention will be described, referring to a flowchart of FIG. 7.

In step S1, the displacement tolerance determination unit 11 shown in FIG. 1 determines displacement tolerance of the device pattern 103 shown in FIG. 4, based on specifications of elements and so on. Note that the displacement tolerance may be previously stored in the displacement tolerance memory 4 shown in FIG. 1.

The variation determination unit 12 determines variation $\Delta P1$ of process condition tolerance as shown in FIG. 2, based on displacement tolerance of a device pattern stored in the displacement tolerance memory 4. Note that variation $\Delta P1$ of the process conditions may be stored in the variation memory 5 shown in FIG. 1.

In step S21, the size prediction module 131 shown in FIG. 1 reads information of the mask pattern 102 from the mask pattern memory 3, and the variation $\Delta P1$ of the process condition shown in FIG. 2 from the variation memory 5. The size prediction module 131 then predicts the plurality of sizes Wp of the device pattern 103 shown in FIG. 4, respectively, in accordance with process conditions at the plurality of limits P11~P16 of the process condition variation $\Delta P1$.

In step S22, the displacement calculation module 132 shown in FIG. 1 calculates a difference between the size Wp of the predicted device pattern 103 shown in FIG. 4 and the size Wd of the design pattern 101, as the plurality of displacements ΔWp respectively.

In step S23, the average calculation module 133 shown in FIG. 1 calculates an average of the plurality of displacements ΔWp calculated by the displacement calculation module 132.

In step S31, the correction value determination module 141 reads the displacement tolerance ΔWp from the displacement tolerance memory 4, and then determines the optical proximity correction value ΔWc so that the average of the plurality of displacements ΔWp calculated by the average calculation module 133 falls within the displacement tolerance.

In step S32, as shown in FIG. 6, the correction module 142 corrects the mask pattern 102 using the optical proximity correction value ΔWc determined by the correction value determination module 141.

According to the embodiment of the present invention, the displacement ΔWp shown in FIG. 4 is predicted according to the process condition variation ΔP1 shown in FIG. 5 to correct the mask pattern 102 as shown in FIG. 6. The process condition variation ΔP1 shown in FIG. 5 can therefore be obtained as a process margin. Accordingly, as shown in FIG. 4, even when the process conditions vary within the variation ΔP1 shown in FIG. 5 in actually forming the device pattern 103, the displacement ΔWp falls within the displacement tolerance. The desired specification of the device implemented by the device pattern 103 can therefore be obtained.

Determining the optical proximity correction value ΔWc such that each of the plurality of displacements ΔWp falls within the displacement tolerance places a very large load on the calculation. On the other hand, the average calculation module 133 shown in FIG. 1 calculates the average of the plurality of displacements ΔWp and determines the optical proximity correction value ΔWc such that the average falls within the displacement tolerance. Accordingly, the calculation load can be decreased. The optical proximity correction value ΔWc can therefore be easily determined, and the process condition variation ΔP1 can be stably established as the process margin.

Figure 7:
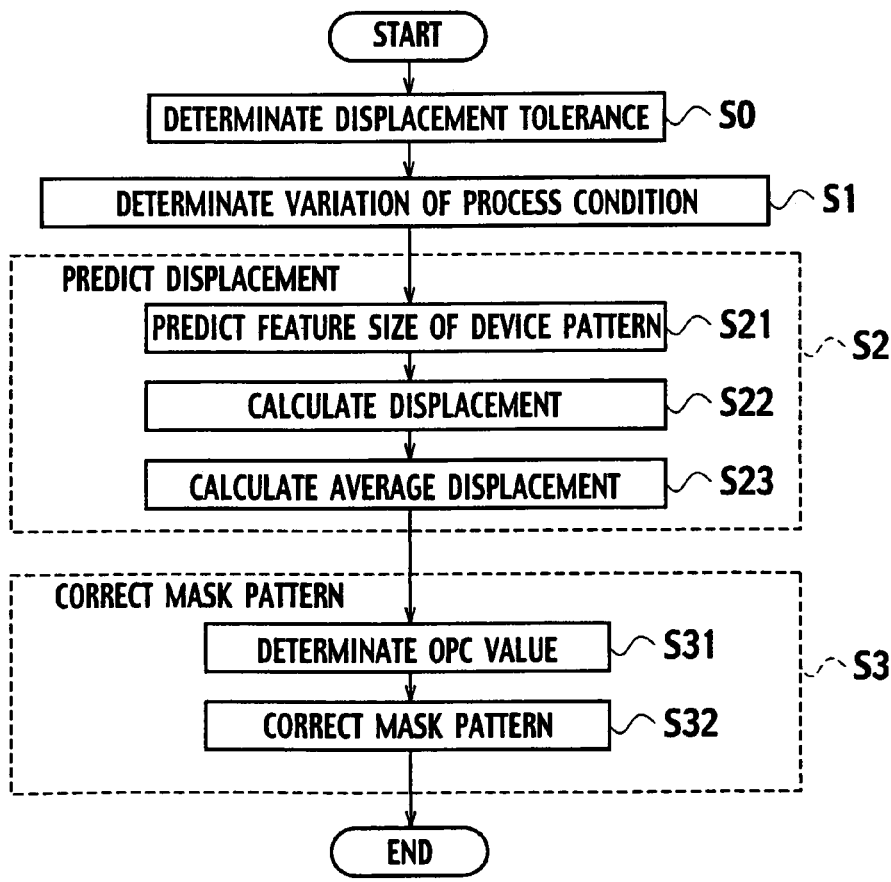
FIG. 7 is a flowchart showing an example of a method for correcting a mask pattern according to the embodiment of the present invention.

The procedures shown in FIG. 7 can be executed by controlling the CPU 1 with a program, which algorisms thereof equal to the procedures. The program can be stored in a computer-readable storage medium. The procedures of the method of generating mask data can be performed, by reading the program from the computer-readable storage medium to the main memory 9 or the like.

Here, the "computer-readable storage medium" means any media that can store a program, including, e.g., external memory units, semiconductor memories, magnetic disks, optical disks, magneto-optical disks, magnetic tape, and the like for a computer. To be more specific, the "computer-readable storage media" include flexible disks, CD-ROMs, MO disks, and the like. For example, the main body of the mask pattern correction system can be configured to incorporate a flexible disk drive and an optical disk drive, or to be externally connected thereto. A flexible disk is inserted into the flexible disk drive, a CD-ROM is inserted into the optical disk drive, and then a given readout operation is executed, whereby programs stored in these storage media can be installed on the main memory 9. In addition, by connecting given drives to the mask pattern correction system, it is also possible to use, for example, a ROM or magnetic tape. Furthermore, it is possible to store a program in another program storage device via an information processing network, such as the Internet.

Figure 8:
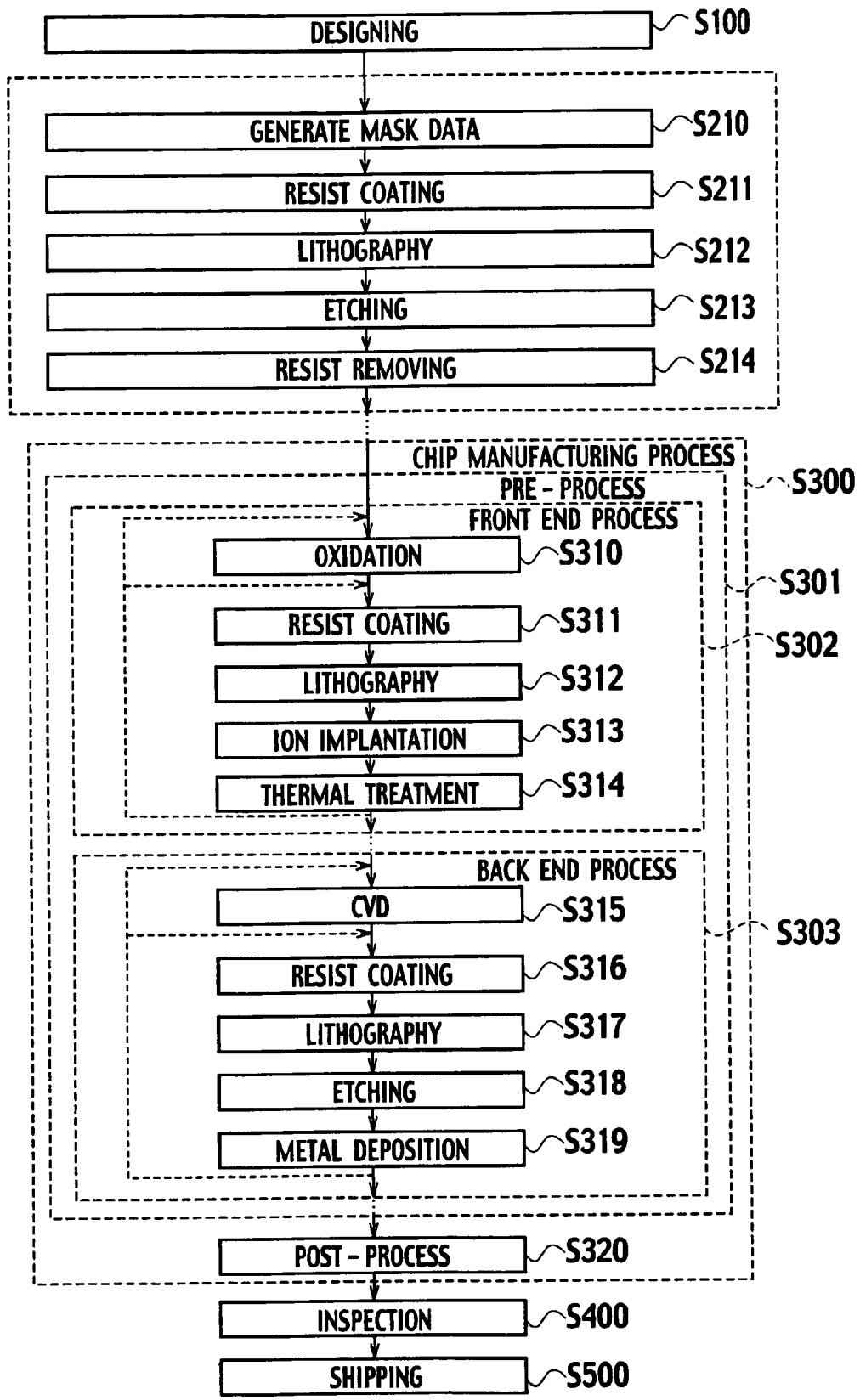
FIG. 8 is a flowchart showing an example of a method for manufacturing a semiconductor device according to the embodiment of the present invention.

Next, a description will be made regarding a method for manufacturing a semiconductor device (a large-scale integrated circuit LSI), with reference to FIG. 8.

In Step S100, process mask simulation is carried out. Device simulation is performed by use of a result of the process mask simulation and each of the current and voltage values to be input to each of the electrodes is set. Circuit simulation of the LSI is performed based on electrical properties obtained by the device simulation. Accordingly, layout data (design data) of device patterns is generated for each layer of the device layers corresponding to each stage in a manufacturing process.

In step S210, after the design patterns of the layout data for the each layers generated in step S100, mask patterns are generated by temporarily setting an optical proximity correction value. The generated mask patterns are stored in the mask pattern memory 3 shown in FIG. 1. The displacement prediction unit 13 shown in FIG. 1 calculates a displacement in accordance with a process condition variation, using the mask patterns stored in the mask pattern memory 3 and the process condition variation stored in the variation memory 5. The correction unit 14 determines an optical proximity correction value so that the displacement falls within a displacement tolerance. The correction unit 14 corrects the mask pattern using the optical proximity correction value. Furthermore, the correction unit 14 generates mask data of the corrected mask patterns. The mask data is stored in the mask pattern memory 2 shown in FIG. 1.

On the other hand, in step S211, a mask substrate is prepared, in which a light shielding film (metal film) of chrome (Cr) or the like is formed on a transparent substrate of silica glass or the like. Generally, a photoresist film is applied on the mask substrate, but if the photoresist film is not applied, photoresist is applied and prebaked. In step S212, the mask data stored in the mask pattern memory 2 shown in FIG. 1 is read out and converted into pattern data by a pattern data converter. The mask substrate is then mounted on a mask substrate stage of a pattern generator (PG), and the photoresist film on the mask substrate is exposed and developed using the pattern data, thus transferring the corrected mask pattern to the photoresist film. Consequently, the corrected mask patterns of the photoresist film coated on a light shielding film of the mask substrate. Therefore, washing and post bake (cure) are carried out.

In step S213, using the photoresist film (resist pattern) as the mask, the light shielding film of the mask substrate is processed by reactive ion etching (RIE) or the like. In step S214, the remaining photoresist film is removed by ashing. The corrected mask pattern is thus formed on the mask substrate, and the photomask is fabricated. The photomask is fabricated for each layer corresponding to each step of the manufacturing process of an LSI to prepare a set of photomasks.

Next, a series of processes including an oxidation process in Step S310, a resist coating process in Step S311, the photolithography process in Step S312, an ion implantation process in Step S313, a thermal treatment process in Step S314, and the like are repeatedly performed in a front-end process (substrate process) in Step 302 for a plurality of lots. In step S313, a resist film (a photo resist film) is spin-coated on a semiconductor wafer. In step S312, the mask patterns of the photomasks provided in step S200 are transferred on a photo resist of each of the wafers. The photo resist is developed, and etching masks made of resist film are delineated by exposing device patterns of one of the masks in the set of masks. In step S313, the semiconductor wafer is processed using the etching masks delineated in step S312. When the above-described series of processes are completed, the procedure advances to Step S303.

In Step S303, a back-end process (surface wiring process) for wiring the substrate surface is performed. A series of processes including a chemical vapor deposition (CVD) process in Step S315, a resist coating process in Step S316, the photolithography process in Step S317, an etching process in Step 318, a metal deposition process in Step 319, and the like are repeatedly performed in the back-end process. In Step S317 which is similar to step S312, the mask patterns of the photomasks are transferred on a photo resist of each of the wafers. The photo resist is developed, and etching masks made of resist film are delineated by exposing device patterns of one mask in the set of masks. When the above-described series of processes are completed, the procedure advances to Step S304.

When a multilayer wiring structure is completed and the pre-process is finished, the substrate is diced into chips of a given size by a dicing machine such as a diamond blade in Step S304. A chip is then mounted on a packaging material made of metal, ceramic or the like. After electrode pads on the chip and leads on a leadframe are connected to one another, a desired package assembly process, such as plastic molding, is performed.

In Step S400, the semiconductor device is completed after an inspection of properties relating to performance and function of the semiconductor device, and other given inspections on lead shapes, dimensional conditions, a reliability test, and the like. In Step S500, the semiconductor device which has cleared the above-described processes is packaged to be protected against moisture, static electricity and the like, and is then shipped out.

According to the method for manufacturing a semiconductor device according to the embodiment, in step S200, displacement of a device pattern is predicted in accordance with the process condition variation such as exposures, focus, aberration, optical beam shapes, sizes of resist patterns, etching conditions and so on. Then mask patterns, like the mask pattern 102 are corrected, and thereafter a set of photomasks is provided. Therefore, it is possible to obtain desired specifications of a semiconductor integrated circuit provided by the device pattern 103, even when the process conditions, such as exposures, focus, aberration, optical beam shapes, sizes of the resist patterns, etching conditions and so on, are changed.

(First Modification)

Figure 9:
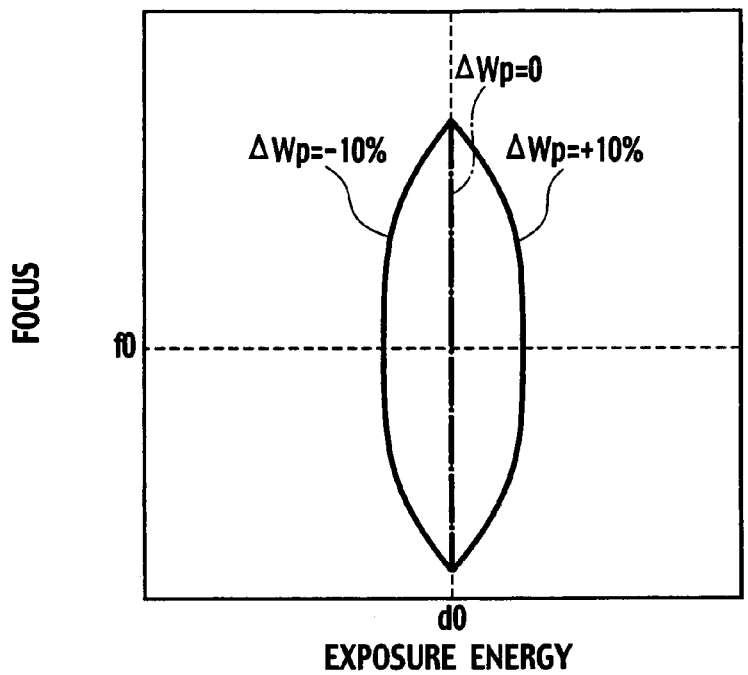
FIG. 9 is a graph showing an example of an ED-tree of a L/S pattern according to a first modification of the embodiment of the present invention.

In a first modification of the embodiment of the present invention, the variation determination unit 12 shown in FIG. 1 determines a process condition variation common to several types of design patterns. FIG. 9 shows the exposure and focus in the L/S pattern. A dash dotted line ($\Delta Wp=0$) represents the exposure and focus when the displacement $\Delta Wp$ is 0, that is, when the size of the design pattern is equal to the size of the device pattern. Real lines ($\Delta Wp=\pm 10\%$) represent the exposure and focus where the displacement is $\pm 10\%$. As is apparent from comparison with the process conditions in the isolated pattern shown in FIG. 5, the process conditions corresponding to the same displacement vary depending on the type of design pattern, since the intensity of diffracted illumination varies on surrounding patterns arrangement.

In the OPC, it is important to obtain a large process margin common to all of the types of design patterns. The variation determination unit 12 shown in FIG. 1 determines a process condition variation $\Delta P2$ common to the isolated pattern and L/S pattern as shown in FIG. 10, based on the process conditions of the isolated pattern shown in FIG. 5 and the process conditions of the L/S pattern shown in FIG. 9.

Figure 10:
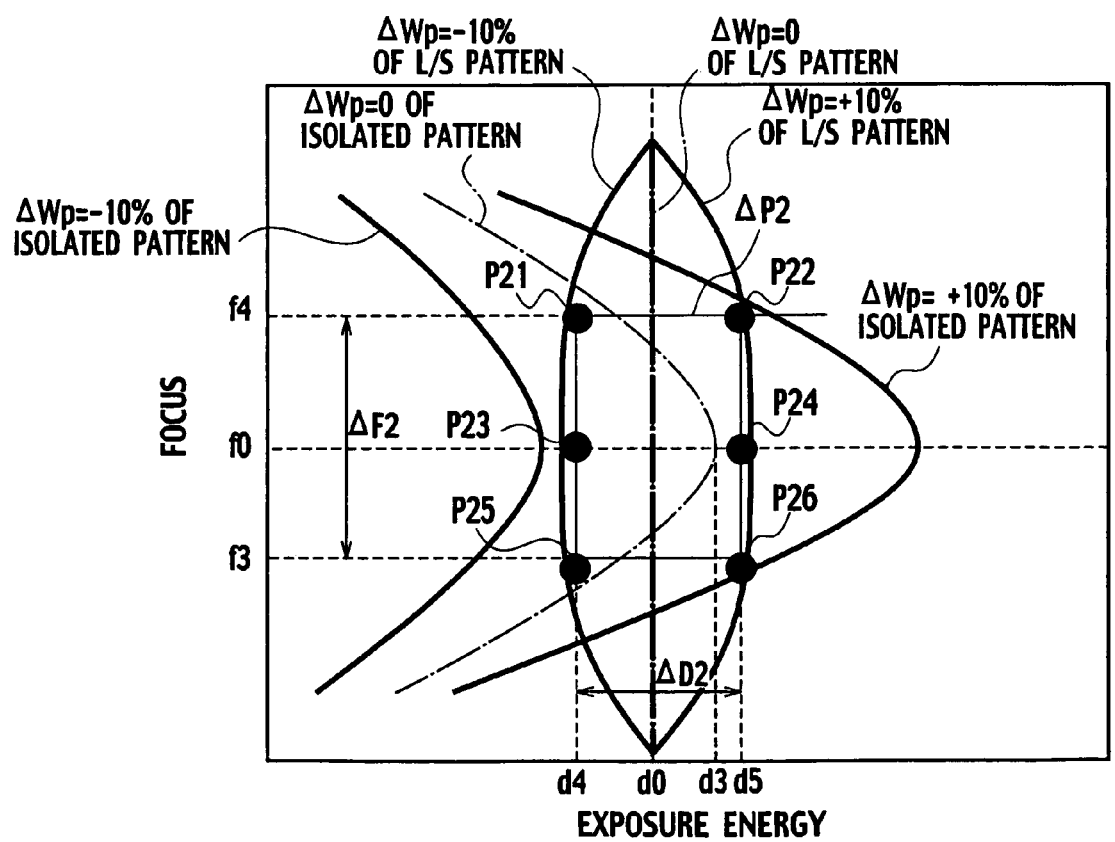
FIG. 10 is a graph showing an example of an ED-tree of an isolation pattern and a L/S pattern according to the first modification of the embodiment of the present invention.

The displacement prediction unit 13 shown in FIG. 1 predicts averages of a plurality of displacements of the isolated pattern and a plurality of displacements of the L/S pattern according to the process conditions at limits P21 to P26 of the process condition variation $\Delta P2$ shown in FIG. 10. The correction unit 14 corrects mask patterns corresponding to the isolated pattern and L/S pattern so that the averages of the plurality of displacements of the isolated pattern and L/S pattern fall within the displacement tolerance, respectively.

Figure 11:
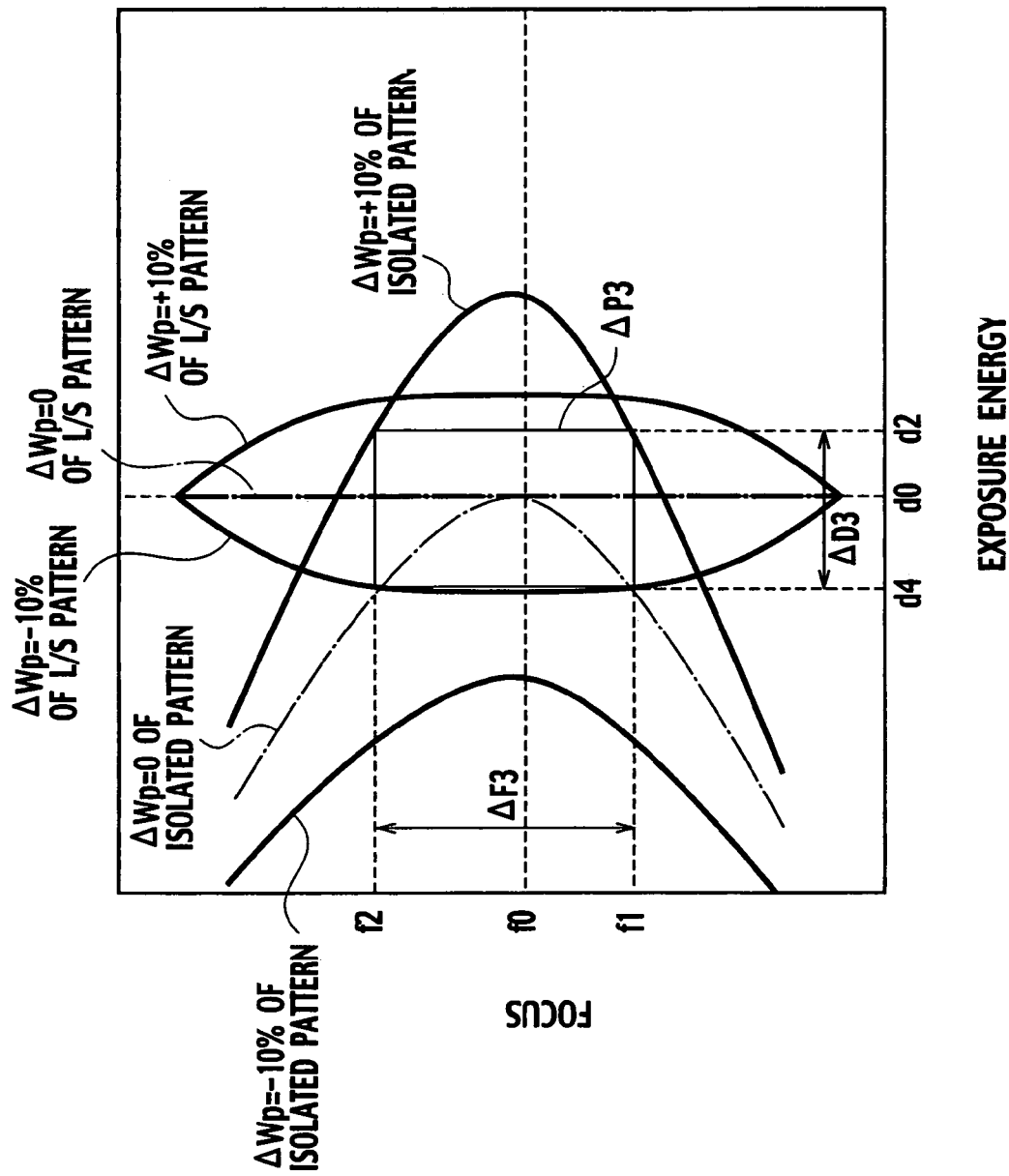
FIG. 11 is a graph showing an example of an ED-tree of an isolation pattern and a L/S pattern according to a comparative example.

In a comparative example shown in FIG. 11, the mask pattern is corrected so that the isolated pattern and L/S pattern coincide with the respective design patterns under particular process conditions (exposure: d0, best focus: f0). On the contrary, according to the first modification, as shown in FIG. 10, the exposure when the size of the device pattern is equal to the size of the design pattern at the best focus f0 is shifted from an exposure d0 to an exposure d3. Accordingly, the process condition variation $\Delta P2$ is determined to be larger than a process condition variation $\Delta P3$ shown in FIG. 11. The process condition variation $\Delta P2$, which is larger than the process condition variation $\Delta P3$, can therefore be obtained as the process margin.

(Second Modification)

Figure 12:
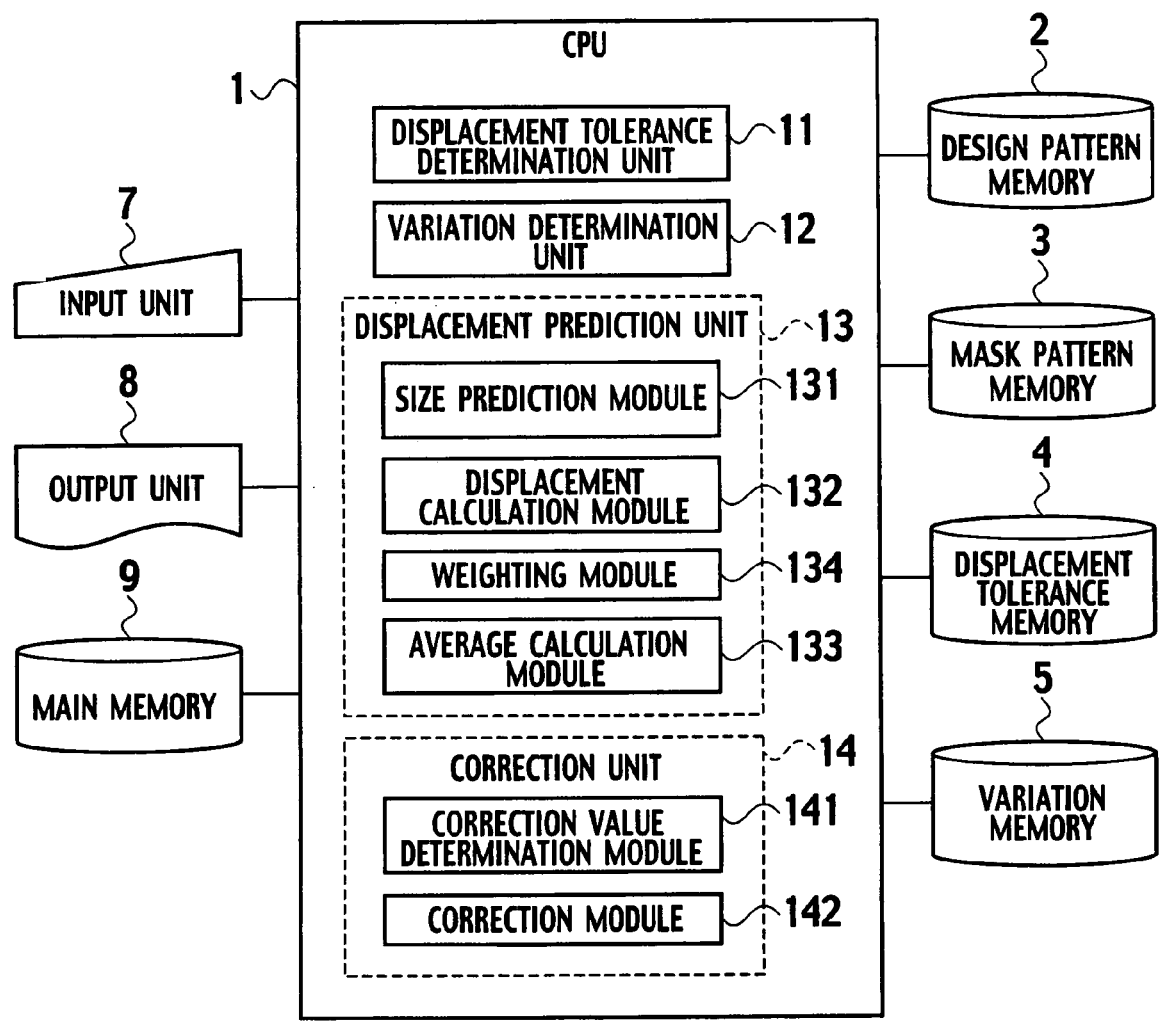
FIG. 12 is a block diagram showing an example of a mask pattern correction system according to a second modification of the embodiment of the present invention.

A mask pattern correction system according to a second modification of the embodiment of the present invention differs from that shown in FIG. 1 in that it further includes a weighting module 134 as shown in FIG. 12. FIG. 5 shows the rectangular window of the process condition variation $\Delta P1$. However, in reality, the process condition varies around a set process condition according to a certain probability distribution. In practice, there is a probability distribution in which the probability is the highest at a process condition variation of 0, that is, at the set process condition and the closer to the limits P11, P12, P15, and P16 of the process condition variation $\Delta P1$, the lower the probability.

Figure 13:
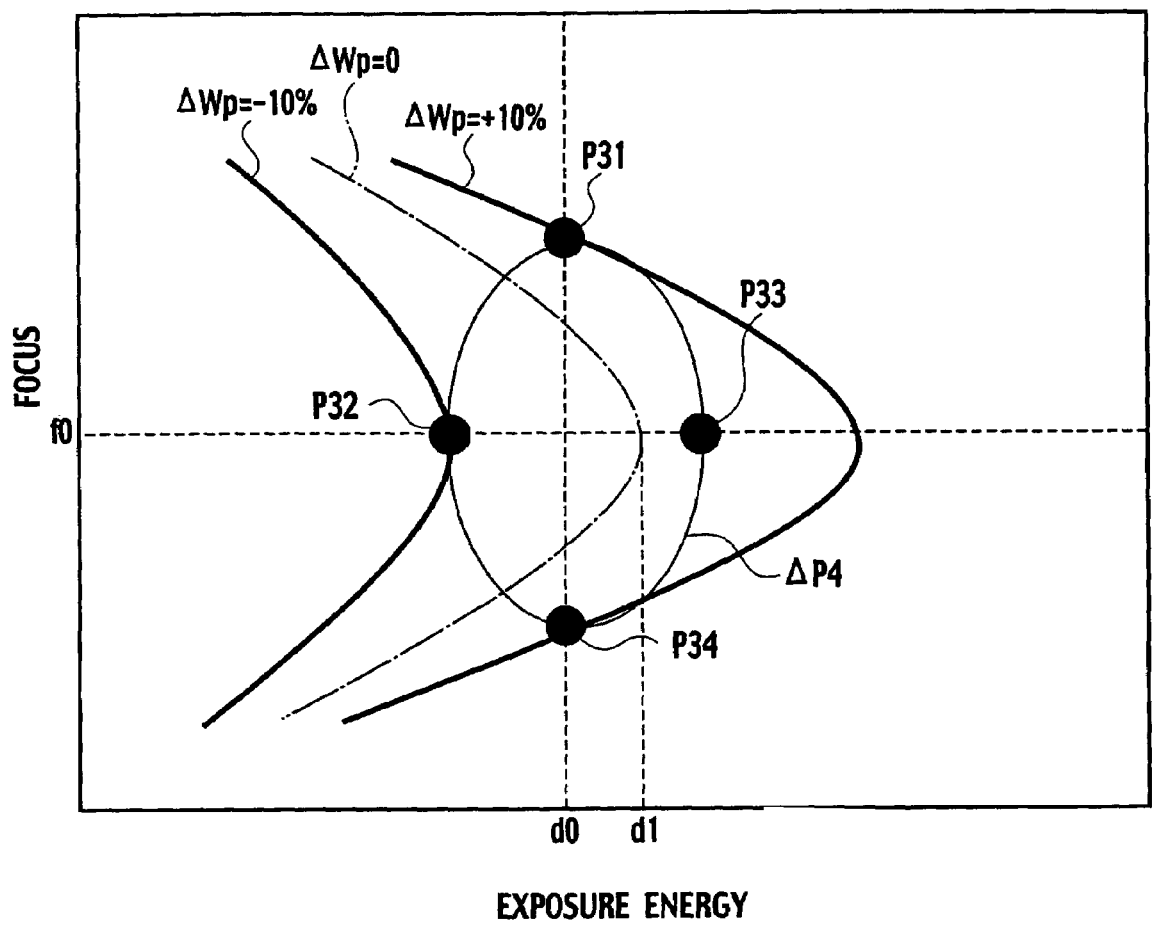
FIG. 13 is a graph showing an example of an ED-tree of an isolation pattern according to the second modification of the embodiment of the present invention.

As shown in FIG. 13, the variation determination unit 12 shown in FIG. 12 determines an elliptical window of a process condition variation $\Delta P4$ taking into account the probability distribution of the process condition variation. The displacement calculation module 132 shown in FIG. 12 calculates a plurality of displacements at the plurality of limits P31 to P34 of the process condition variation $\Delta P4$ shown in FIG. 13.

The weighting module 134 shown in FIG. 12 determines weighting coefficients of not less than 0 and not more than 1 for the plurality of displacements calculated by the displacement calculation module 132, according to the probability distribution of the process condition variation $\Delta P4$. Furthermore, the weighting module 134 calculates products of the plurality of displacements calculated by the displacement calculation module 132 and the respective weighting coefficients to weigh the plurality of displacements. The average calculation module 133 calculates an average of the plurality of displacements weighted by the weighting module 134. The other configurations are substantially the same as that of the mask pattern correction system shown in FIG. 1, and a redundant description is omitted.

According to the second modification, the mask pattern is corrected such that displacements according to limits P31 to P34 of the process condition variation $\Delta P4$ fall within the displacement tolerance. The process condition variation $\Delta P4$, which is more practical than the process margin $\Delta P1$ shown in FIG. 5, can therefore be obtained as the process margin.

Figure 14:
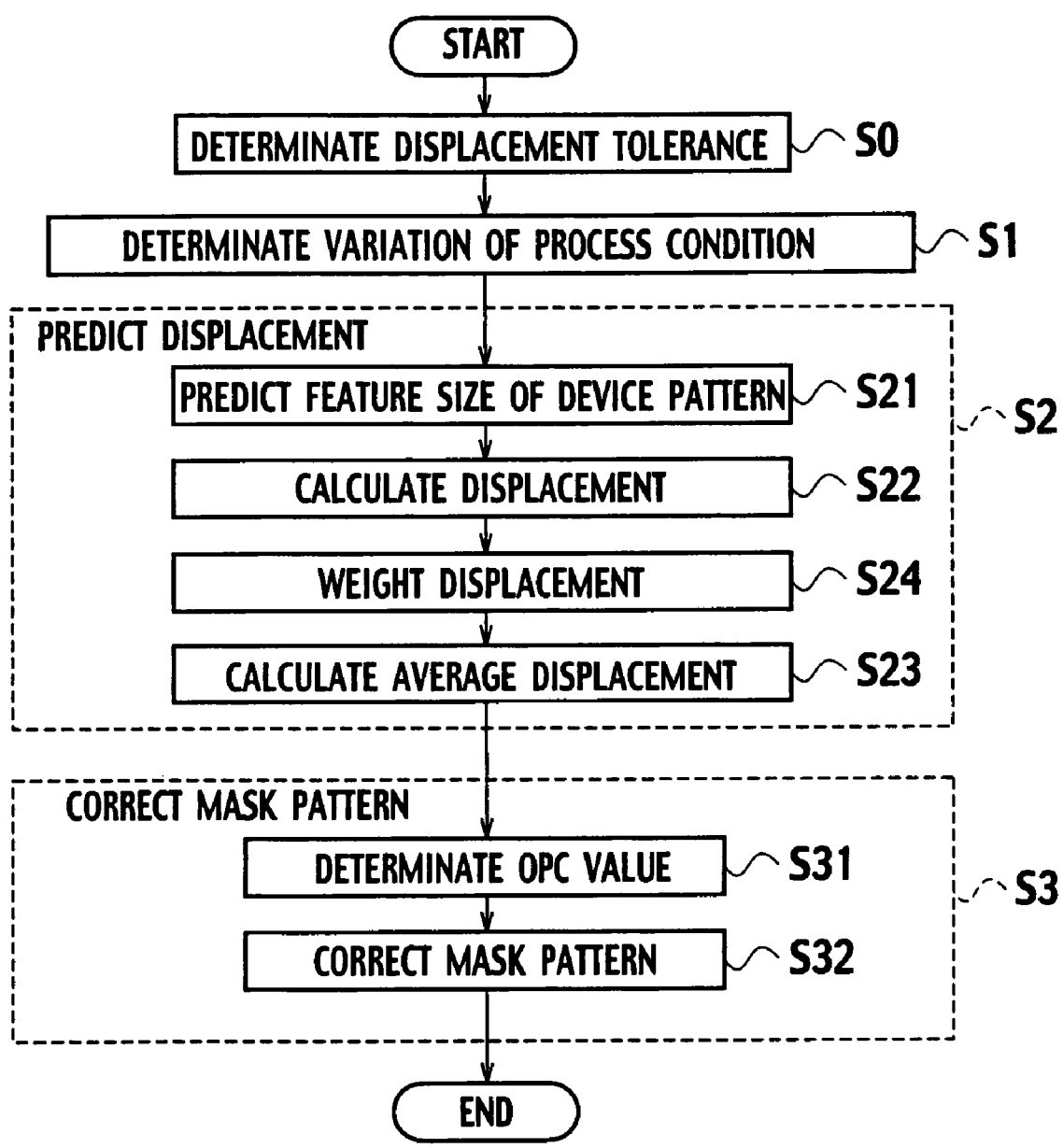
FIG. 14 is a flowchart showing an example of a method for correcting a mask pattern according to the second modification of the embodiment of the present invention.

As shown in FIG. 14, the mask pattern correction method according to the second modification is similar to that shown in FIG. 7 in the lead-up to the procedure to calculate the displacements in the step S22. The difference between the mask pattern correction method according to the second modification and that shown in FIG. 7 is that, in the step S23 shown in FIG. 14, the weighting module 134 weighs the displacements calculated by the displacement calculation module 132 according to the probability distribution of the process condition variation.

Figure 15:
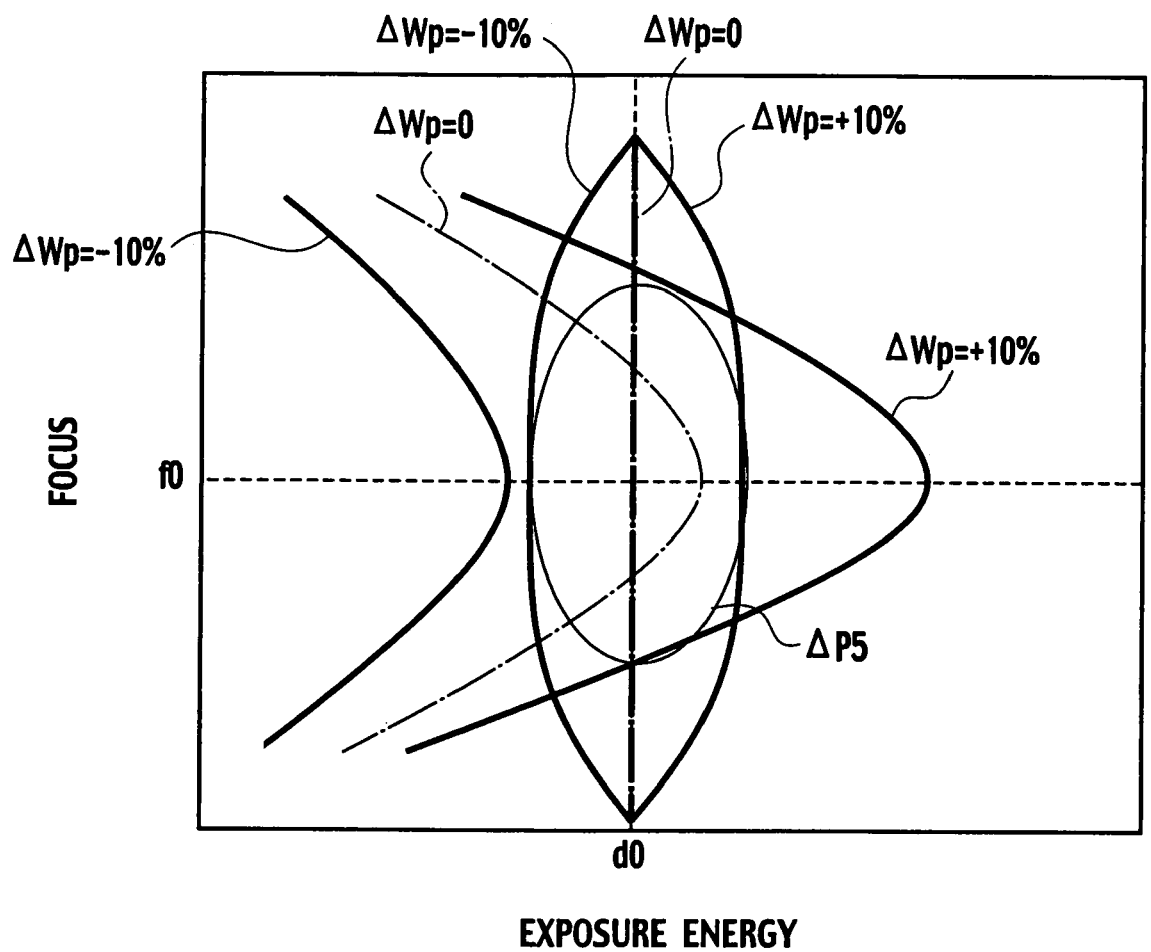
FIG. 15 is a graph showing an example of an ED-tree of an isolation pattern and a L/S pattern according to the second modification of the embodiment of the present invention.

Moreover, when determining the process condition variation common to the isolated and L/S patterns, the variation determination unit 12 may determine an elliptical window of a common process condition variation ΔP5 instead of the rectangular window of the process condition variation ΔP2 shown in FIG. 10, taking into account the probability distribution as shown in FIG. 15.

(Third Modification)

Figure 16:
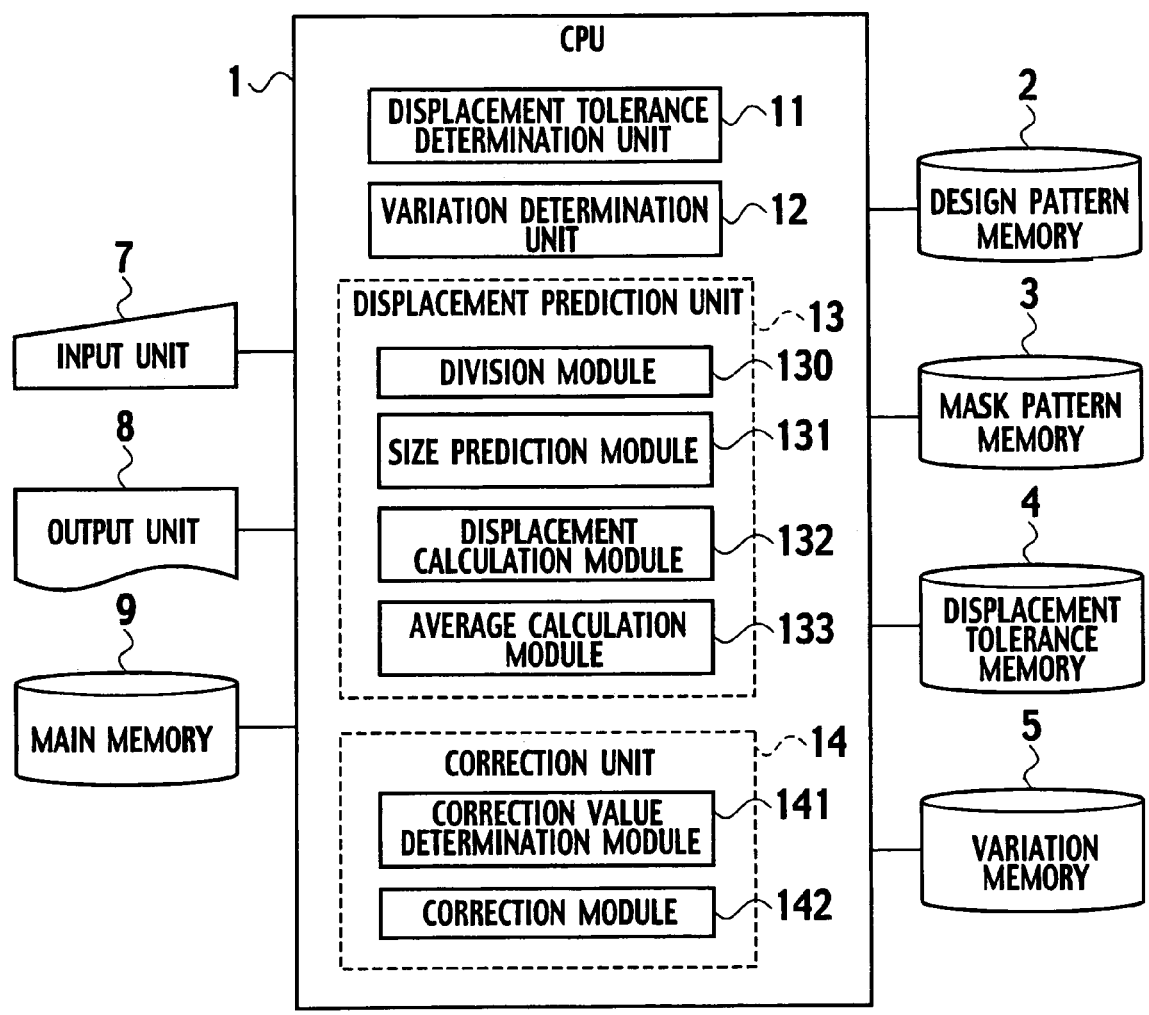
FIG. 16 is a block diagram showing an example of a mask pattern correction system according to a third modification of the embodiment of the present invention.
Figure 17:
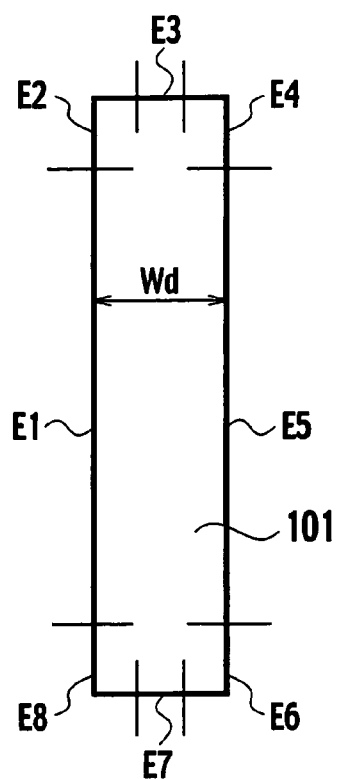
FIG. 17 is a schematic view showing an example of a design pattern according to the third modification of the embodiment of the present invention.

A mask pattern correction system according to a third modification of the present invention differs from that shown in FIG. 1 in that it further includes a division module 130 as shown in FIG. 16. The division module 130 divides the edge of the design pattern 101 into a plurality of edges E1 to E8 as shown in FIG. 17. Lengths of the plurality of edges E1 to E8 and the number of divisions can be arbitrarily set through the input unit 7.

Figure 18:
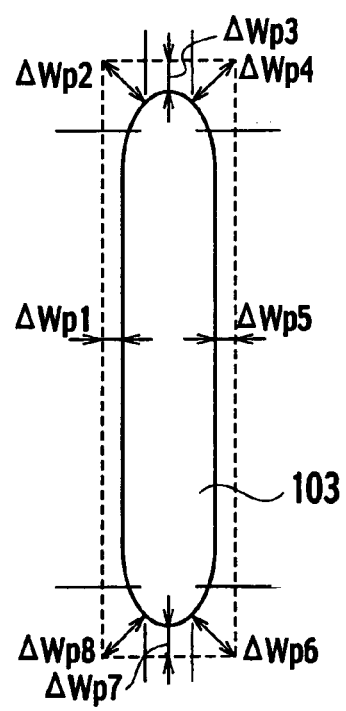
FIG. 18 is a schematic view showing an example of a predicted device pattern according to the third modification of the embodiment of the present invention.

The displacement calculation module 132 shown in FIG. 16 calculates a plurality of displacements ΔWp1 to ΔWp8 for each of the plurality of edges E1 to E8 according to the process condition variation as shown in FIG. 18. The average calculation module 133 shown in FIG. 16 calculates an average of the plurality of displacements ΔWp1 to ΔWp8 for each of the plurality of edges E1 to E8.

Figure 19:
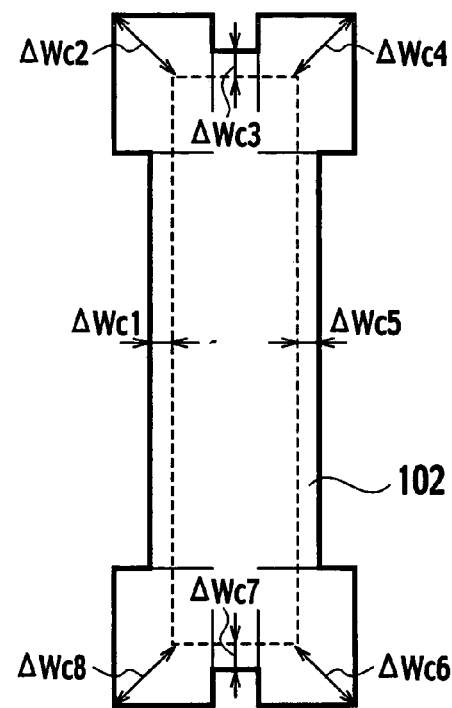
FIG. 19 is a schematic view showing an example of a mask pattern according to the third modification of the embodiment of the present invention.

The correction value determination module 141 determines the optical proximity correction values ΔWc1 to ΔWc8 for each of the plurality of edges E1 to E8 such that each of the averages of the plurality of displacements ΔWp1 to ΔWp8 falls within the displacement tolerance. As shown in FIG. 19, the correction module 142 corrects the mask pattern 102 for each of the plurality of edges E1 to E8 using the optical proximity correction values ΔWc1 to ΔWc8.

Figure 20:
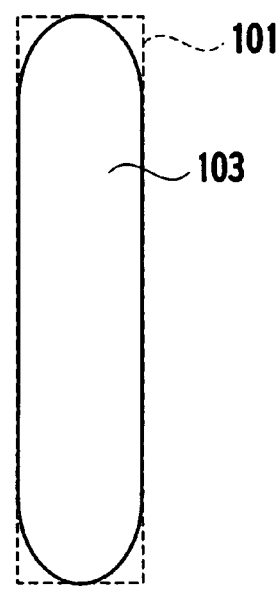
FIG. 20 is a schematic view showing an example of an actually device pattern according to the third modification of the embodiment of the present invention.

According to the third modification, the plurality of displacements ΔWp1 to ΔWp8 are predicted for each of the plurality of edges E1 to E8 so as to correct the mask pattern 102. The device pattern 103 can therefore be formed closer to the design pattern 101 as shown in FIG. 20.

Figure 21:
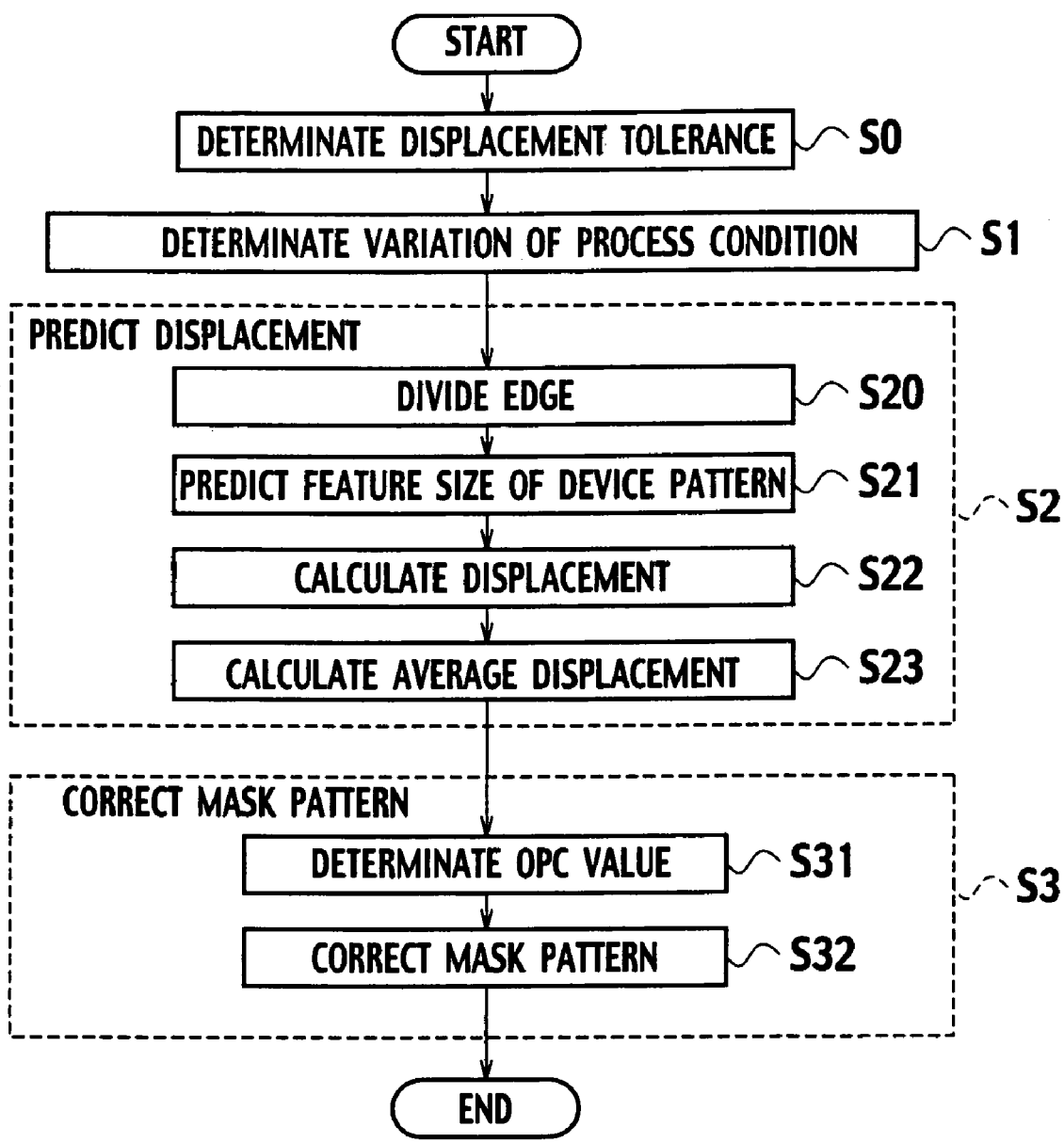
FIG. 21 is a block diagram showing an example of a method for correcting a mask pattern according to the third modification of the embodiment of the present invention.

As shown in FIG. 21, the mask pattern correction method according to the third modification differs from the method shown in FIG. 7 in that the division module 130 shown in FIG. 16 divides the edge of the design pattern 101 into the plurality of edges. E1 to E8 in step S20 and the correction module 142 corrects the mask pattern 102 for each of the edges E1 to E8 in steps S21 to S32.

OTHER EMBODIMENT

Various modifications will become possible for those skilled in the art after receiving the teachings of the present disclosure without departing from the scope thereof.

Figure 22:
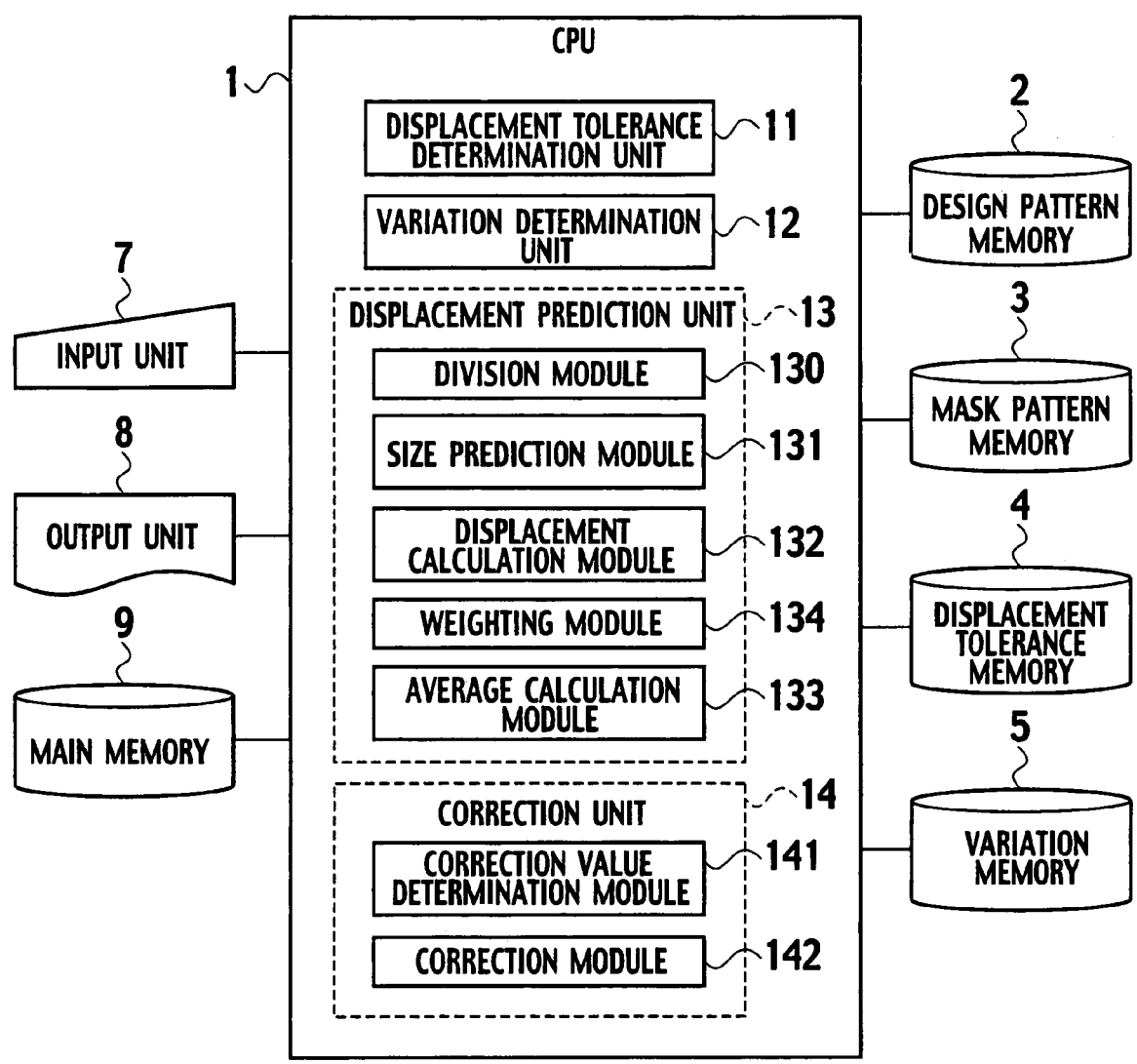
FIG. 22 is a block diagram showing an example of a mask pattern correction system according to other embodiment of the present invention.
Figure 23:
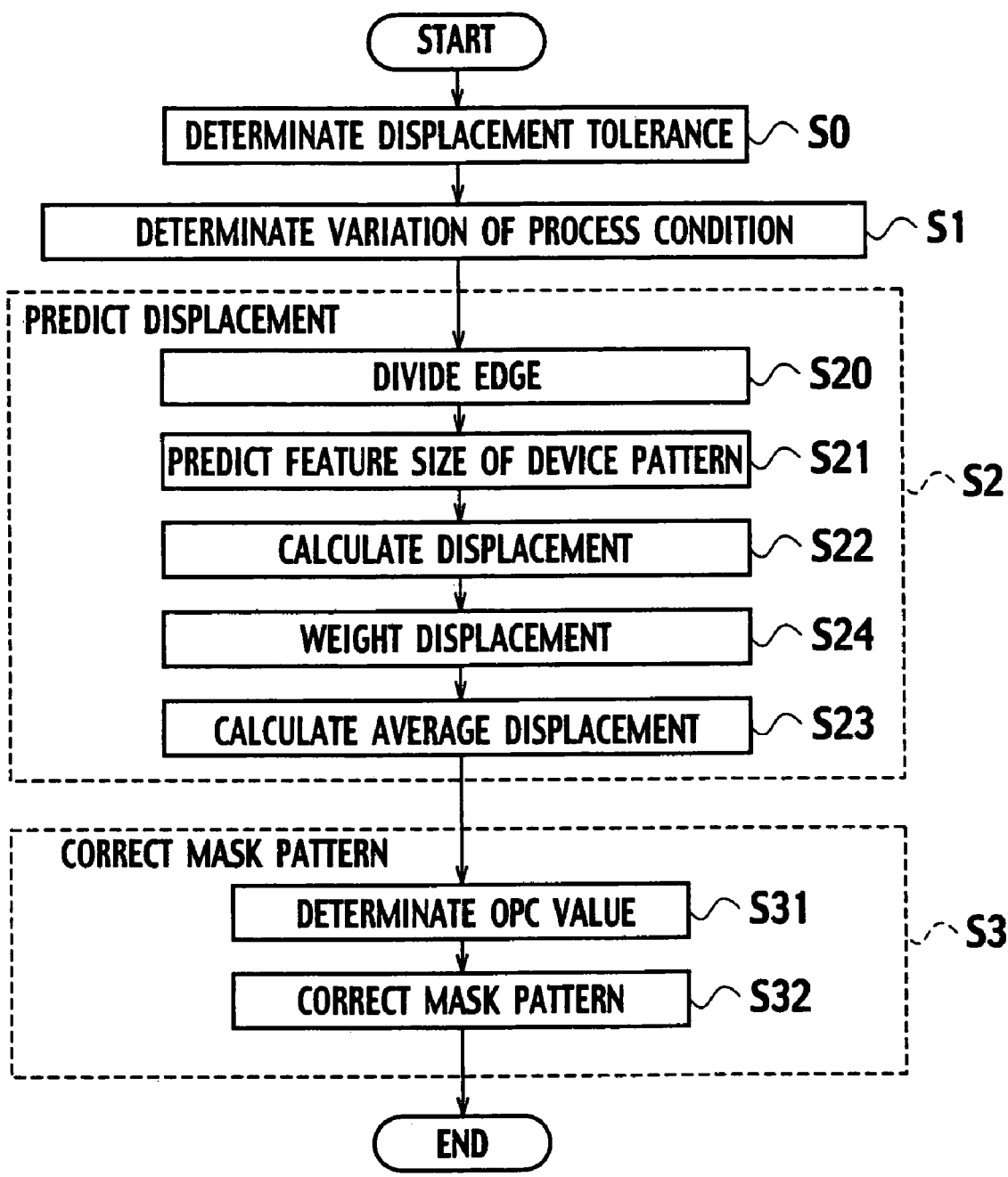
FIG. 23 is a flowchart showing an example of a method for correcting a mask pattern according to the other embodiment of the present invention.

For example, as shown in FIG. 22, a mask pattern correction system according to another embodiment differs from the system shown in FIG. 1 by further including the division module 130 shown in FIG. 12 and the weighting module 134 shown in FIG. 16. The division module 130 shown in FIG. 22 divides the edge of the design pattern into a plurality of edges. The weighting module 134 weights the displacements of the device pattern calculated for each of the plurality of edges. The other configurations are substantially the same as the configuration of the mask pattern correction system shown in FIG. 1, and a redundant description is omitted. A mask pattern correction method according to the above embodiment differs from the method shown in FIG. 7 in that the edge of the design pattern 101 is divided into the plurality of edges in the step S20 and the displacements calculated for each of the plurality of edges are weighted in the step S24 as shown in FIG. 23.

The variation determination unit 12 shown in FIG. 1 may determine a variation of a process condition other than the exposure and focus as a process condition variation ΔP1 shown in FIG. 2. The variation determination unit 12 may determine a variation of one type of process conditions and may determine a variation common to three or more types of process conditions.

The points of the process condition selected to predict the displacements ΔWp are not particularly limited to the limits P11 to P16 of the process condition variation ΔP1 shown in FIG. 5. For example, the displacements ΔWp may be predicted according to the process conditions at a plurality of arbitrary points in the process condition variation ΔP1. Furthermore, the number of points selected to predict the displacements ΔWp is not particularly limited.

As the design pattern, the examples of the isolated and L/S patterns are shown, but the types and the number of types of design patterns are not limited. The variation determination unit 12 shown in FIG. 1 may determine a process condition variation common to three or more types of design patterns, for example, all types of design patterns.

What is claimed is:

1. A computer implemented method for correcting a mask pattern comprising:
    predicting a plurality of displacements of a device pattern by using a mask pattern to form the device pattern and variations of a plurality of process conditions, respectively;
    weighting the plurality of displacements, respectively;
    calculating an average of a plurality of weighted displacements;
    determinating an optical proximity correction value so that the average falls within a displacement tolerance of the device pattern; and
    correcting the mask pattern using the optical proximity correction value.

2. The method of claim 1, wherein predicting at least one of the plurality of displacements comprises predicting at least one of the plurality of displacements in accordance with a limit of the variations.

3. The method of claim 1, wherein predicting at least one of the plurality of displacements comprises:
    predicting a size of the device pattern; and
    calculating a difference between the size of the predicted device pattern and a size of a design pattern corresponding to the device pattern as the at least one of the plurality of displacements.

4. The method of claim 1, wherein predicting at least one of the plurality of displacements comprises:
    dividing an edge of the device pattern into a plurality of edges; and
    predicting at least one of the plurality of displacements in each of the edges.

5. The method of claim 4, wherein correcting the mask pattern comprises determining a plurality of optical proximity correction values so that the at least one of the plurality of displacements at each of the edges falls within the displacement tolerance.

6. The method of claim 5, further comprising determining a variation common to each of a plurality of device patterns.

7. The method of claim 1, wherein at least one of the plurality of process conditions is one of an exposure condition, a focus condition, an aberration condition, and an optical beam shape when the mask pattern is transferred to a resist film, a size of a resist pattern obtained by transferring an image of the mask pattern to the resist film, and an etching condition when a base film is processed using the resist pattern as a mask.

8. A system for correcting a mask pattern comprising:
a displacement prediction unit comprising:
a displacement calculation module configured to calculate a plurality of displacements of a device pattern by using a mask pattern to form the device pattern and variations of a plurality of process conditions, respectively;
a weighting module configured to weight the plurality of displacements, respectively;
an average calculation module configured to calculate an average of the plurality of weighted displacements; and
a correction unit configured to determine an optical proximity correction value so that the average falls within a displacement tolerance of the device pattern, and to correct the mask pattern using the optical proximity correction value.

9. The system of claim 8, wherein the displacement prediction unit predicts at least one of the plurality of displacements in accordance with a limit of at least one of the variations.

10. The system of claim 8, wherein the displacement prediction unit comprises:
a size prediction module configured to predict a size of the device pattern wherein the displacement calculation module is configured to calculate a difference between the size of the predicted device pattern and a size of a design pattern corresponding the device pattern as at least one of the plurality of displacements.

11. The system of claim 8, wherein the displacement prediction unit comprises:
a division module configured to divide an edge of the device pattern into a plurality of edges wherein the displacement calculation module is configured to predict at least one of the plurality of displacements for each of the edges.

12. A program stored on a computer readable storage device and configured to be executed by a computer for executing an application on a system for correcting a mask pattern, comprising:
instructions for predicting a displacement of a device pattern by using a mask pattern to form the device pattern and a plurality of displacements by variations of a plurality of process conditions, respectively;
instructions for weighting the plurality of displacements, respectively;
instructions for calculating an average of the plurality of weighted displacements;
instructions for determining an optical proximity correction value so that the average falls within a displacement tolerance of the device pattern; and
instructions for correcting the mask pattern using the optical proximity correction value.

* * * * *